United States Patent [19]

Carson et al.

[11] 4,048,566

[45] Sept. 13, 1977

[54] SUPPRESSED CARRIER AUTOMATIC GAIN CONTROL CIRCUITRY

[75] Inventors: Lansing M. Carson, Tempe; Neil E. Welter, Scottsdale, both of Ariz.

[73] Assignee: Motorola Inc., Schaumburg, Ill.

[21] Appl. No.: 646,729

[22] Filed: Jan. 5, 1976

[51] Int. Cl.² .............................................. H04B 1/68
[52] U.S. Cl. ...................................... 325/329; 325/49; 325/408; 325/419; 325/476
[58] Field of Search ............... 325/49, 50, 329-331, 325/404, 408, 411, 414, 402, 65, 473-476, 417, 419, 421, 346; 328/166

[56] References Cited

U.S. PATENT DOCUMENTS

| | | | |
|---|---|---|---|
| 3,005,094 | 10/1961 | Taylor | 325/329 |
| 3,084,329 | 4/1963 | Clay | 325/476 |
| 3,611,145 | 10/1971 | O'Connor | 325/473 |

*Primary Examiner*—Robert L. Griffin
*Assistant Examiner*—Jin F. Ng
*Attorney, Agent, or Firm*—Eugene A. Parsons

[57] ABSTRACT

An automatic gain control (hereinafter referred to as AGC) circuitry is used in conjunction with a Costas loop detector to provide positive gain control during the acquisition and tracking modes of the operation of a receiver. The circuitry includes circuitry for deriving a noise estimate signal from one channel of the Costas loop and circuitry for subtracting the noise estimate signal from the data and noise signal combination in the other channel of the Costas loop for providing the automatic gain control signal to prevent false locking.

3 Claims, 11 Drawing Figures

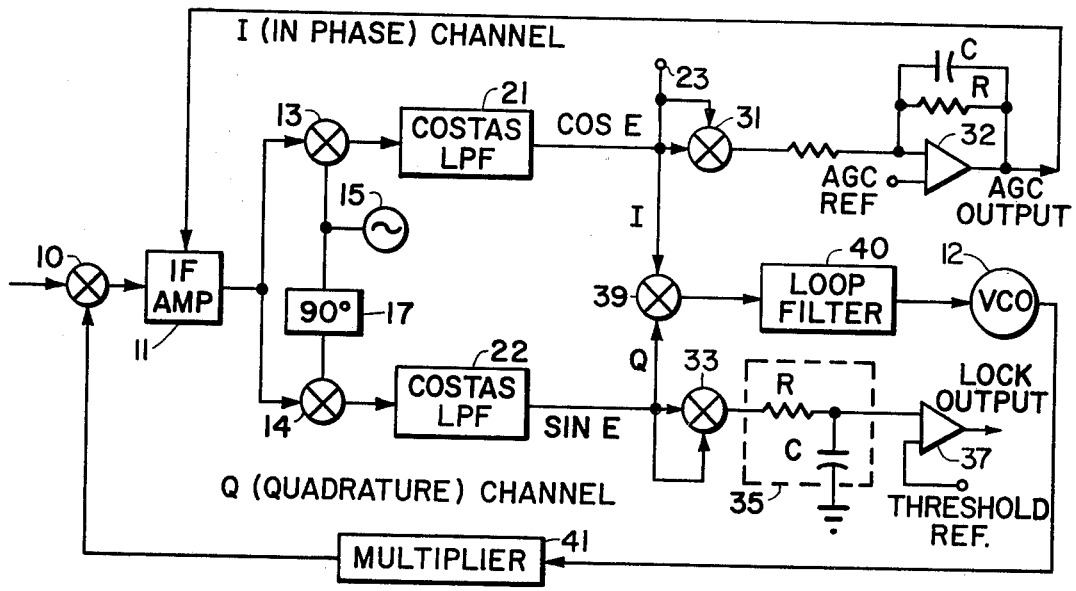
FIG. 1 (PRIOR ART)
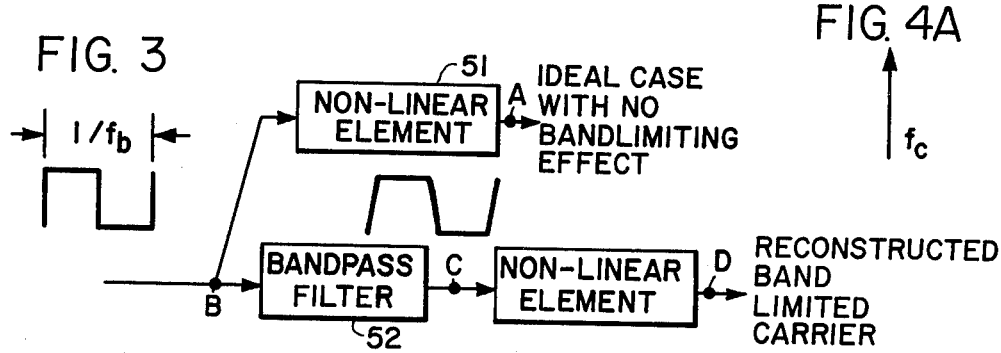
FIG. 3
FIG. 4A
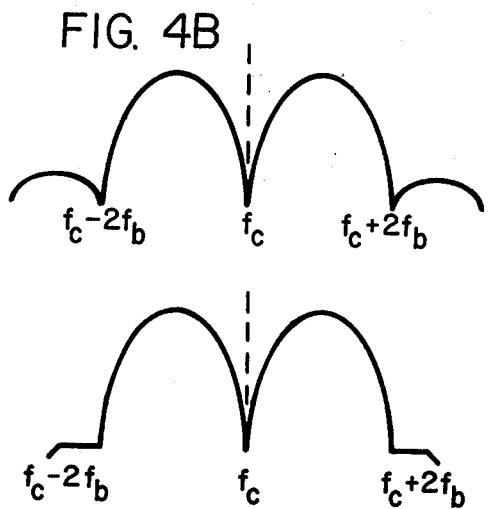
FIG. 4B
FIG. 4C
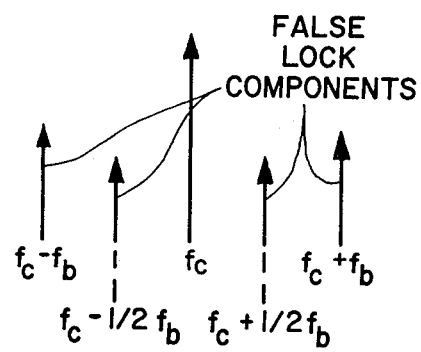
FIG. 4D

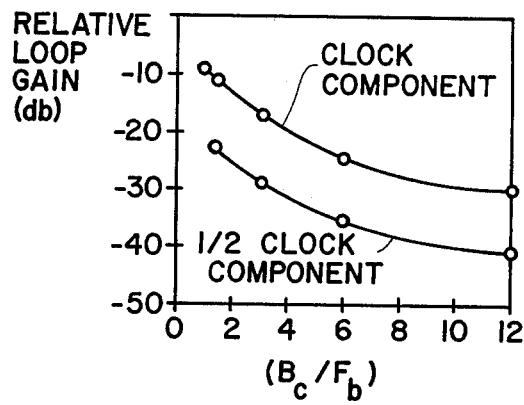
FIG. 5
MEASURED LOOP GAIN OF CLOCK RELATED FALSE COMPONENTS
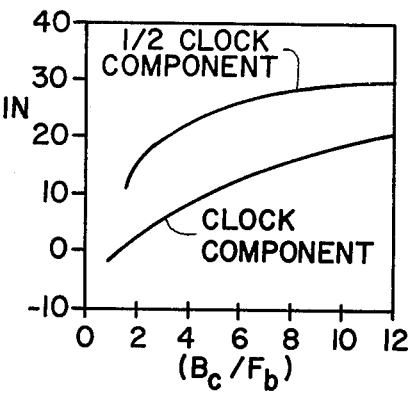
FIG. 6
CALCULATED FALSE LOOP GAIN MARGIN
FIG. 7
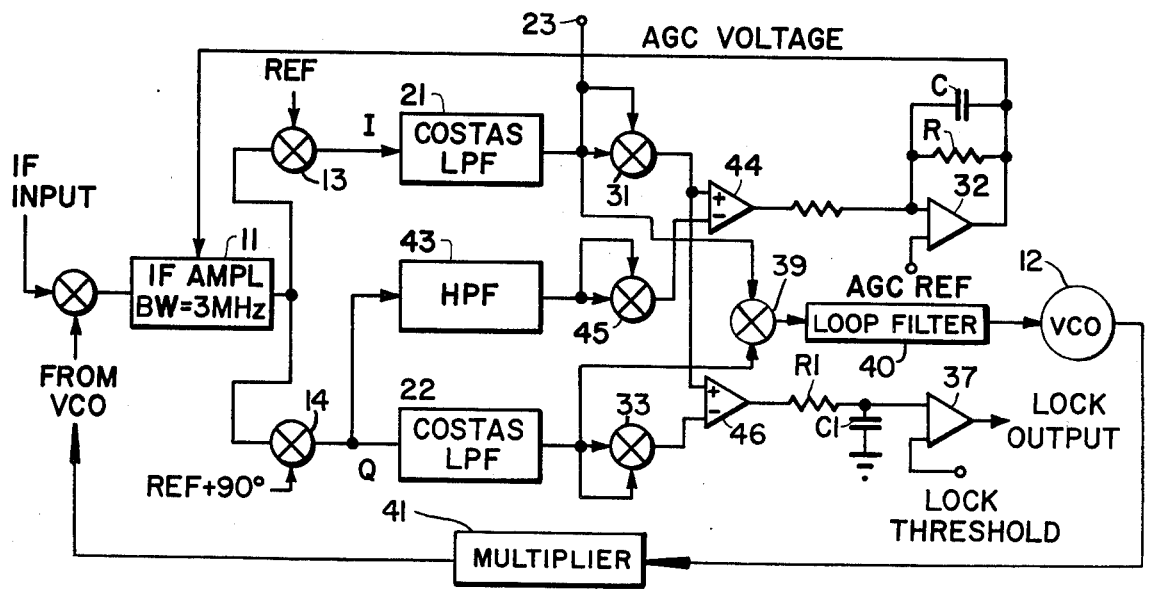

SUPPRESSED CARRIER AUTOMATIC GAIN CONTROL CIRCUITRY

FIELD OF THE INVENTION

This invention relates to a suppressed carrier signal receiver and, in particular, to an improved AGC circuitry in the suppressed carrier signal receiver for preventing false lock in such a receiver.

PRIOR ART

In the early phases of the development of the suppressed carrier signal receiver the now well known Costas loop was extensively used. In such a receiver a noncoherent or total power AGC control apparatus was employed usually to provide the loop gain control. The control apparatus includes means for deriving an AGC output from one channel of the Costas loop, for example, the in-phase channel by detecting the incoming signal with a square law detector and means for comparing the resulting output with an AGC reference signal to provide the AGC feedback control signal. The signal detected in the in-phase channel contained not only the signal but also the noise contributed by the thermal noise of the receiver. However, such prior art AGC control circuitry was found still susceptible to the false lock.

SUMMARY OF THE INVENTION

It is an object of the present invention to provide an improved receiver of the type adapted to receive suppressed carrier signals.

It is another object of the present invention to provide an improved receiver of the type adapted to receive suppressed carrier signals with an improved AGC circuitry that prevents false locking of the receiver.

The foregoing and other objects of the present invention are obtained by providing a network in the Costas loop that includes means for deriving a noise estimate signal from one channel of the Costas loop and means for subtracting the noise estimate signal from the data and noise signal combination detected from the other channel and providing an automatic gain control signal that prevents false locking of the receiver.

The foregoing and other objects and features of the present invention will be more clearly apprehended from the following detailed description of an illustrative embodiment in conjunction with the accompanying drawings.

BRIEF DESCRIPTION OF THE FIGURES

FIG. 1 shows a prior art functional block diagram of a receiver of the type with a Costas loop adapted to receive suppressed carrier signals.

FIG. 3 shows a block diagram of a suppressed carrier receiver.

FIGS. 4A-4D show response characteristics of the suppressed carrier receiver that illustrate false lock condition.

FIGS. 5-6 show various response characteristics of the prior art receiver.

FIG. 7 shows the AGC receiver of the type with the Costas loop shown in FIG. 1 modified to provide the automatic gain control signal that prevents false locking of the receiver in accordance with present invention.

DETAILED DESCRIPTION

Figure 2:
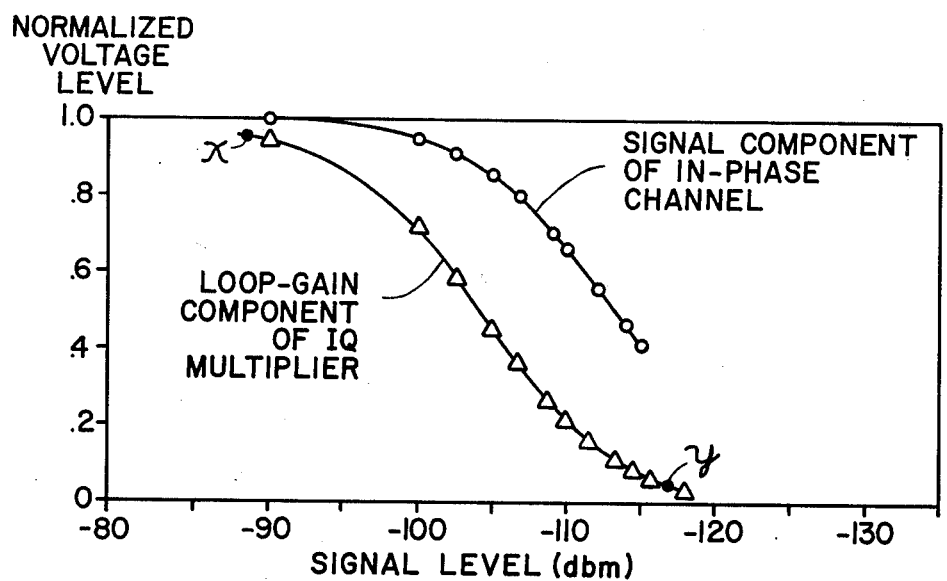
FIG. 2 shows loop gain and in-phase channel response characteristics.

In the conventional suppressed carrier receiver with the Costas loop, total power AGC signal is developed to provide the AGC control before and after the acquisition of the incoming signal. Such a prior art apparatus is illustrated in FIG. 1. The receiver is provided with a mixer 10, and an IF amplifier detector 11. The IF input is mixed with a voltage controlled oscillator (VCO) 12 output. The mixer output is amplified and decomposed into the in-phase and quadrature components by multipliers 13 and 14 under the control of a reference oscillator 15 for the in-phase channel and under the control of the oscillator 15 output after it is 90° phase shifted by a phase-shifting for the quadrature channel circuit 17. The decomposed signals in the respective channels are filtered through low pass filters 21 and 22 disposed in the two channels.

The in-phase of I channel signal (Cos E) output is used as the data output via output terminal 23 and is also used to obtain an AGC output feedback control signal using a square law detector 31 and AGC comparator 32. The quadrature phase or Q channel signal (Sin E) is similarly processed through a square law detector 33, an RC filter 35 and a threshold reference comparator 37 to provide a lock out signal.

As schematically illustrated, the in-phase and quadrature-phase signals are also used to obtain the voltage controlled oscillator (VCO) signal using an IQ multiplier 39, a loop filter 40 and the VCO 12 in a conventional manner. The VCO output is then applied to the mixer 10 via a multiplier 41 in a conventional manner.

As illustrated above, according to the prior art, the total power AGC control method utilizes the total power output which represent the combined power of signal and noise power appearing in the in-phase (Cos E) branch to derive the AGC feed back control signal to the IF. During the signal acquisition, the signal acquired is composed of the demodulated bi-phase data modulated by the beat frequency in the acquisition loop made up of the in-phase channel and the AGC output feedback to the IF amplifier 11. After acquisition, the gain control is provided by the data signal plus noise as follows. The signal plus noise estimate is provided by the square law detector 31 whose DC output is filtered and amplified to establish the desired AGC loop parameters.

More specifically, the lock detection is obtained by estimating the total power in the quadrature channel (Sin E) as follows: first by estimating the total power by the use of square law detector 33 in the quadrature channel and then subjecting the output of the square law detector to the RC filter circuitry 35 and then comparing the output to a preset threshold reference signal using a conventional comparator 37. When the loop is out of lock, the signal in the quadrature channel (Sin E) is substantially the same as the signal in the in-phase channel, except for its phase which is quadrature removed from the in-phase signal.

When the lock is achieved the beat note and data modulation no longer exists in the quadrature channel. Consequently only the small noise component produces an output from the square law detector in the quadrature channel. The comparator 37 provides the inlock and out of lock signal by comparing the threshold reference signal to the output of the square law detector. By suitable design of the comparator and provision of the suitable reference voltage, the output of the comparator 37 is made to present one level of DC potential to represent out of lock condition and another level of potential to represent in lock condition.

In obtaining the automatic gain control signal the amplifier 32 compares the output of the square law detector 31 with an automatic gain control reference signal. In a conventional manner RC filter may be used to limit the lock detection response time and thereby smooth out the detected noise signal at the output of the comparator 32.

Since the total power AGC method utilizes signal plus noise estimation it causes inherent signal and loop gain suppression at the low signal to noise ratios near threshold as illustrated in the normalized voltage level versus signal characteristics shown in FIG. 2. FIG. 2 shows measured total power AGC characteristics; in the upper curve, the nature of the signal component of the in-phase channel is shown; in the lower curve, the nature of the loop gain component of IQ multiplier is shown. Ordinarily this signal suppression can be accommodated in the same manner as limiter suppression in a conventional receiver. However, the bandwidth expansion and loop gain increase at stronger signal present problems to the Costas loop in that they tend to false lock on the clock components.

FIG. 3 and FIGS. 4A-4D illustrate, in a simplified form, the process by which a false lock takes place in a conventional prior art suppressed carrier receiver. In an ideal case, as shown in FIG. 3, if an ideal detector 51 of nonlinear element character can be found, it could be used to obtain the carrier, $f_c$, (FIG. 4A) from the suppressed carrier input (FIG. 4B). However, in fact, such an ideal detector is not available. So instead, a suitable bandpass filter 52 used generally to band limit the input signal to obtain a band limited output (FIG. 4C) and then the band limited output is processed through a nonlinear element detector of some kind to obtain the carrier. The detected output (FIG. 4D), however, contains spectral components, $f_c-f_b, f_c-\frac{1}{2}f_b, f_c+\frac{1}{2}f_b, f_c+f_b$, which are multiples of the half of the clock rate of the data. As illustrated in FIG. 4D, these spectral components, that are related to the carrier, $f_c$, and the bandwidth, $f_b$, of the receiver render the conventional receiver, susceptible to false lock, i.e., the receiver tends to lock onto a spectral component other than the carrier, $f_c$.

Thus, it is evident that the mechanism by which a false lock is generated is a subtle one. In short, for a suppressed carrier signal, the nonlinear operation of squaring or multiplication reproduces the desired carrier component alone only if the inputs to the nonlinear device are not band limited. The magnitude of the false lock components, $f_c-f_b, f_c-\frac{1}{2}f_b, f_c+\frac{1}{2}f_b, f_c+f_b$, will be a function of the ratio of Costas low pass filter bandwidth ($B_c$) to data rate ($F_b$).

For the false lock to pose a problem for the suppressed carrier detector it is found that two criteria must be satisfied. First the receiver must sweep through the false lock frequency during its acquisition. Secondly, the receiver loop gain must be sufficiently high to allow acquisition at a certain desired sweep rate.

For a proposed acquisition range, for example, of $+\Delta f$ kHz, the maximum frequency uncertainty during acquisition is $2\Delta f$ kHz. Thus, any data rate or half data rate component below this frequency is a potential false lock candidate.

The false lock components can be characterized by loop gain relative to the desired signal and a false lock loop bandwidth, $\beta_{FL}$. Experimentally, a false lock component loop gain was measured using the configuration shown in FIG. 1 and they were found as illustrated in FIG. 5 wherein the vertical axis repesents in normalized form, relative gain and the horizontal line represents the bandwidth to data rate ($B_c/F_b$) ratio. From FIG. 5, the effective loop bandwidth for both clock and ½ clock components for various ratios of pre-multiplier filter bandwidths to data rates ($B_c/F_b$) can be computed by the following equation.

$\beta_{FL} = \beta_{LA} G_R$
$\beta_{FL}$ = False lock loop bandwidth
$\beta_{LA}$ = Acquisition loop bandwidth
$G_R$ = Relative loop gain of false lock component To determine the loop gain margin for each case, it is then only necessary to compute $$G_m = \frac{\beta_m^2}{\beta_{FL}^2}$$

where $\beta_{FL}$ = effective false lock loop bandwidth
$\beta_m$ = minimum possible bandwidth for acquisition at the desired sweep rate.
$G_m$ = False lock margin
$\beta_m$ will occur when the loop phase error is 45° (0.78 rad) and can be computed by $$\beta_m^2 = \frac{1.77}{E} R_s.$$

$R_s$ = sweep rate
$E$ = phase error in radians = 0.78 radians.

The loop gain margin (vertical axis) has been computed for both ½ clock and clock components and is plotted in FIG. 6 against the bandwidth to data rate ratio, $B_c/F_b$.

It is apparent from these results that the optimum premultiplier bandwidth must be a trade off between maximum signal-to-noise ratio and maximum false lock margins. The optimum bandwidth has been determined to be about three to four times the data rate. The significance of these results is that they establish an upper limit on how much the loop gain of the receiver may vary under all conditions of signal levels and frequency offsets.

Referring back to FIG. 2, note that there is approximately 20 to 1 variation in loop gain in the IQ multiplier component. This is evident from the comparison of the gain between a high gain point $x$ and a low gain point $y$. This wide variation in loop gain with the total power AGC renders the total power AGC method helpless in combatting the false locks.

The foregoing discovery of the false lock problems associated with the total power AGC control led the present inventors to search for a solution whereby the loop gain can be made relatively constant at all signal levels. This led to the development of signal power sensing AGC circuitry described hereinbelow.

A functional block diagram of the inventive signal power AGC loop is illustrated in FIG. 7 schematically. As illustrated therein, the signal plus noise power in the inphase channel is estimated by a square law detector 31. The noise power only is estimated by sampling the quadrature channel with a bandpass filter 43 at a frequency where little signal energy is present but which is still within the IF bandwidth. The bandpass filter 43 may be made of a high pass filter that operates in conjunction with the IF filter of the receiver to provide necessary bandpass filtering operation. The signal pluse noise power estimate obtained by the square law detector 31 is applied to a differential amplifier 44 of a conventional design. The noise power is estimated by a square law detector 45 and the output thereof is applied to the differential amplifier 44. The differential amplifier 44 is connected to operate as a subtractive circuitry whereby the noise estimate signal from the noise estimating circuitry made of the filter 43 and square law detector 45 is subtracted from the noise plus signal power estimate signal coming from the square law detector 31 and applied to the differential amplifier 44.

In this manner the differential amplifier 44 provides an output signal which is an estimate of the signal power from which the noise power estimate is subtracted. In this manner, an output is obtained which is an estimate of signal power without the undesirable noise component present in the in-phase channel. This output is then applied to the comparator 32 where it is also filtered by the RC filters circuitry in a conventional manner and where it is compared with the AGC reference signal to provide the AGC feedback control voltage to the input IF amplifier. When the loop is acquiring and tracking, the AGC control is therefore based entirely on the signal power level.

Figure 8:
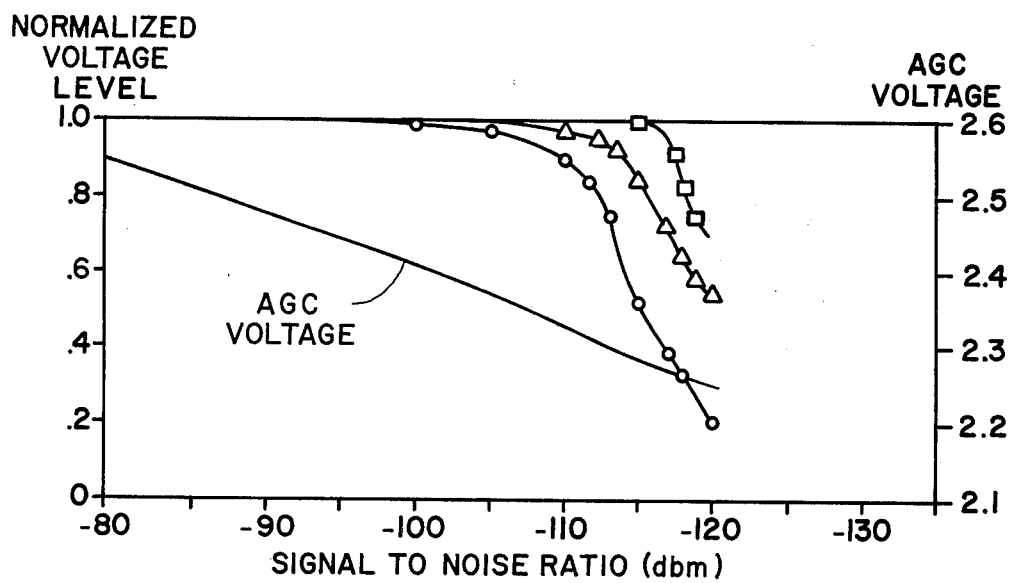
FIG. 8 shows response characteristics of the receiver with the inventive AGC circuitry.

While the ideal realization of this AGC technique would produce a truly constant signal output for any input signal level, practical realization results in some gain variation. The relationship between the input signal power and the output signal power level and the relative loop gain has been measured using an experimental Costas loop detector. The result of the experimentation is illustrated in FIG. 8 where the data signal output level is plotted in the vertical axis in a normalized form and the signal power is plotted in normalized form representing the signal to the noise ratio. The very top curve represents the locked data output level measured as a function of signal power input. The middle curve is the unlocked data plus beat note amplitude. The lower one represents the double beat note amplitude from the IQ multiplier.

The method of developing the in-lock signal with reference to FIG. 7 is by square law detecting the in-phase and quadrature channel outputs and subtracting them. The resulting difference in effect is proportional to the cosine of the tracking phase error since the AGC keeps the signal power constant. When the loop is out of lock, the signals in the in-phase and quadrature channels differ only in phase and when they are square law detected, they produce the same DC components. However, when the difference is formed, a near zero voltage results in lock comparator 37, this being because of the low threshold of the comparator and a low voltage lock signal.

The situation is different from the voltage level produced when the in-phase and quadrature channels are different only in-phase. When the loop locks the digital data is present in the in-phase channel while only noise will exist in the quadrature channel. Now when the difference is formed a substantial DC voltage results and the lock comparator produces a high output signifying the in-lock condition.

The lowpass filter made of R1 and C1 disposed between the comparator 46 and the lock comparator 37 establishes the response time of the lock detector.

Various changes and modifications may be made to the present invention, an illustrative embodiment of which is illustrated and described hereinabove, without departing from the spirit and scope thereof.

What is claimed is:

1. In a receiver of the type adapted to receive suppressed carrier signals such as a receiver with a Costas loop configuration, wherein the incoming signal is decomposed into in-phase and quadrature phase components and processed in two channels to obtain data output, and wherein an automatic gain control signal is obtained and used to provide an automatic gain control feedback signal for stabilizing the amplitude level of data output and the loop gain, the improvement which comprises means for deriving a noise estimate signal from one channel and means for subtracting the noise estimate signal from the data and noise signal combination in the other channel to derive the automatic gain control signal and prevent false locking of the receiver.

2. The receiver according to claim 1, wherein said noise estimating means includes a series network of a high pass filter and a square law detector, said network being connected between the one channel and said subtracting means.

3. The receiver according to claim 2, wherein said subtracting means includes a differential amplifier having first input means coupled to the other channel for receiving the data and noise signal combination and a second input terminal for receiving the noie estimate signal.

* * * * *